(12) United States Patent
Chen et al.

(10) Patent No.: US 9,472,449 B2
(45) Date of Patent: Oct. 18, 2016

(54) SEMICONDUCTOR STRUCTURE WITH INLAID CAPPING LAYER AND METHOD OF MANUFACTURING THE SAME

(71) Applicant: Taiwan Semiconductor Manufacturing CO., LTD., Hsinchu (TW)

(72) Inventors: Kuan-Chia Chen, Hsinchu (TW); Shing-Chyang Pan, Jhudong Township (TW); Chih-Chien Chi, Hsinchu (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 293 days.

(21) Appl. No.: 14/155,682

(22) Filed: Jan. 15, 2014

(65) Prior Publication Data

US 2015/0200126 A1    Jul. 16, 2015

(51) Int. Cl.
*H01L 21/4763* (2006.01)
*H01L 21/768* (2006.01)
*H01L 23/532* (2006.01)

(52) U.S. Cl.
CPC ..... *H01L 21/7684* (2013.01); *H01L 21/76849* (2013.01); *H01L 21/76877* (2013.01); *H01L 23/53223* (2013.01); *H01L 23/53238* (2013.01); *H01L 23/53252* (2013.01); *H01L 23/53266* (2013.01); *H01L 2924/0002* (2013.01)

(58) Field of Classification Search
CPC .................................................. H01L 21/4763
See application file for complete search history.

(56) References Cited

U.S. PATENT DOCUMENTS

2013/0221527 A1    8/2013 Yang et al.

FOREIGN PATENT DOCUMENTS

TW    200532833    10/2005
TW    201304060    1/2013

*Primary Examiner* — Marvin Payen (57) ABSTRACT

A method of fabricating a semiconductor structure includes forming a dielectric layer overlaying a substrate; forming a trench in the dielectric layer; forming a first barrier layer lining the trench; forming a conductive layer overlaying the first barrier layer; forming a second barrier layer overlaying the conductive layer; forming a metallic sacrificial layer to cover the second barrier layer and to fill the trench; and performing a polishing process to remove the materials above a bottom portion of the second barrier layer.

20 Claims, 7 Drawing Sheets

SEMICONDUCTOR STRUCTURE WITH INLAID CAPPING LAYER AND METHOD OF MANUFACTURING THE SAME

BACKGROUND

The semiconductor integrated circuit (IC) industry has experienced rapid growth. Modern integrated circuits are made up of literally millions of active devices such as transistors and capacitors. Technological advances in IC materials and design have produced generations of ICs where each generation has smaller and more complex circuits than the previous generation. These devices are initially isolated from each other, but are later interconnected together through multiple metal layers to form functional circuits. As the IC becomes increasingly more complex, the interconnect structure also becomes more complex, resulting in increasing number of metal layers. Typical interconnect structures include lateral interconnections, such as metal lines (wirings), and vertical interconnections, such as conductive vias and contacts. Unreliable interconnects can limit the performance and density of modern integrated circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In the drawings, the thickness and width of layers and regions may be exaggerated for clarity. Like reference numerals in the drawings denote like elements. The elements and regions illustrated in the figures are schematic in nature, and thus relative sizes or intervals illustrated in the figures are not intended to limit the scope of the present disclosure.

The present disclosure relates generally to a semiconductor structure with an inlaid capping layer and a method of fabricating the semiconductor structure. Specific examples of components and arrangements are described below to simplify the present disclosure. These are, of course, merely examples and are not intended to be limiting. For instance, the formation of a first feature over or on a second feature in the description may include embodiments in which the first and second features are formed in direct contact, and may also include embodiments in which additional features may be formed between the first and second features, such that the first and second features may not be in direct contact. Additionally, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "below," "beneath," "above," "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As semiconductor device sizes continue to shrink, meeting conductivity requirements as well as reliability in multiple metallization fabrication has become more difficult. For example, copper interconnects are utilized in semiconductor structures. Copper interconnects are often formed using damascene processes rather than by direct etching. Damascene processes include forming openings by patterning and etching dielectric layers, and then filling the openings with copper. Because copper diffuses easily into some dielectric materials (also known as electromigration), a diffusion barrier layer is usually deposited on the inner walls of the opening before a copper wiring is formed.

According to various embodiments of the present disclosure, a method of fabricating a semiconductor structure with an inlaid barrier layer is disclosed. The method will be explained in the cross-sectional views of a portion of a semiconductor structure from FIG. 1 to FIG. 6B at various fabrication stages according to various embodiments of the present disclosure. For reasons of simplicity, FIG. 1 to FIG. 6B only illustrate a part of the semiconductor structure, and any intermediate layers between the illustrated portion of the semiconductor structure and the substrate 102 are omitted.

Figure 1:
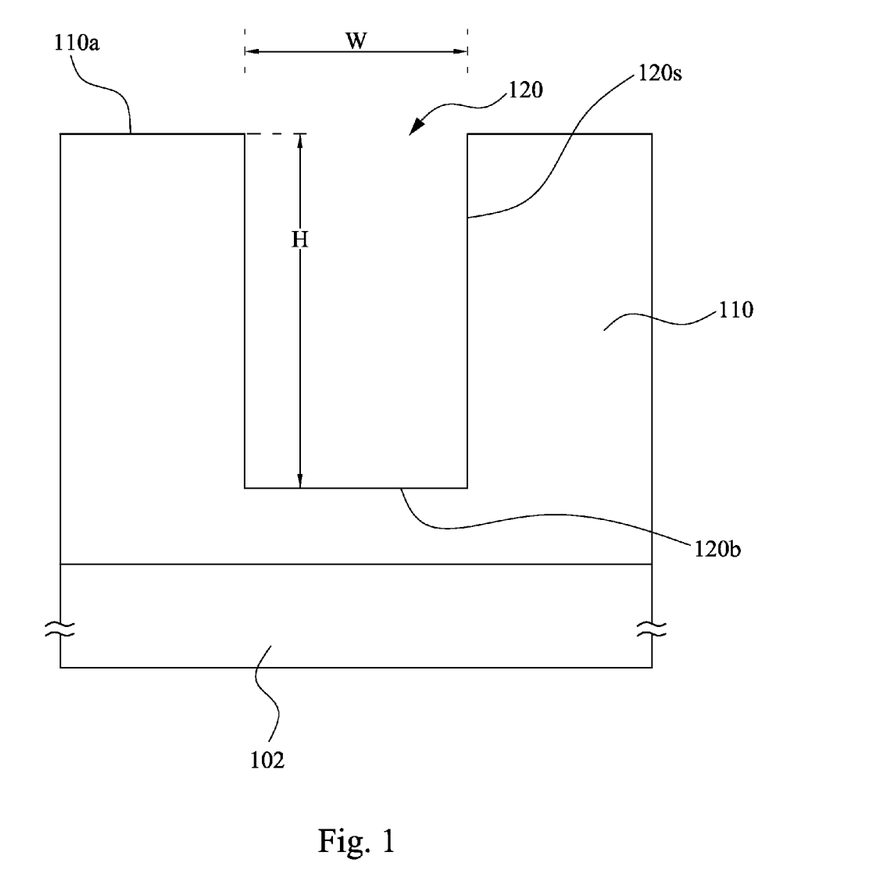
FIGS. 1-5 are cross-sectional diagrams illustrating various process stages of forming a semiconductor structure according to various embodiments of the present disclosure.

Referring to FIG. 1, a dielectric layer 110 is formed over a substrate 102. In some embodiments, the substrate 102 is a silicon substrate doped with either a P-type dopant such as boron, or doped with an N-type dopant such as phosphorous or arsenic. The substrate 102 may alternatively include other elementary semiconductors such as germanium and diamond. The substrate 102 may optionally include a compound semiconductor and/or an alloy semiconductor. Further, the substrate 102 may include an epitaxial layer, may be strained for performance enhancement, and may include a silicon-on-insulator (SOI) structure. The dielectric layer 110 may be a single layer or a multi-layered structure. The dielectric layer 110 is deposited through any of a variety of techniques, such as for example chemical vapor deposition (CVD), physical vapor deposition (PVD), atomic layer deposition (ALD), remote plasma enhanced chemical vapor deposition (RPECVD), spin-coating or another process that is adapted to form a thin film layer over the substrate. For various embodiments of the present disclosure, the dielectric layer 110 is an inter-metal dielectric (IMD) layer or an inter-layer dielectric (ILD) layer. In some embodiments, the dielectric layer 110 may be formed of $SiO_2$, carbon-doped $SiO_2$, for example. In yet some embodiments, the dielectric layer 110 is a nitrogen-containing layer, a carbon-containing layer, or a carbon-containing and nitrogen-containing layer for increasing electromigration resistance.

As shown in FIG. 1, a trench 120 is formed in the dielectric layer 110. The trench 120 may be, for example, a trench line, which is for forming a conductive wiring. The trench 120 may be formed, for example, by forming a patterned photoresist layer (not shown) over the dielectric layer 110 and using a dry-etch processing step to remove portions of the dielectric layer 110 to form the trench 120. Various suitable dry etch processes may be used. After the dry-etch processing step, the patterned photoresist layer (not shown) is removed by, for example, a photolithographic removal process. The trench 120 extends from a top surface 110a of the dielectric layer 110 into the dielectric layer 110, and includes a sidewall portion 120s and a bottom portion 120b. In some embodiment, the trench 120 has a width W of less than about 60 nm and a depth H of about several tens of nanometers to about several hundred nanometers, depending upon the requirement and application of the semiconductor structure. According to various embodiments of the present disclosure, a plurality of the trenches 120 may be formed in the dielectric layer 110 although FIG. 1 depicts a single trench 120 only.

Figure 2:
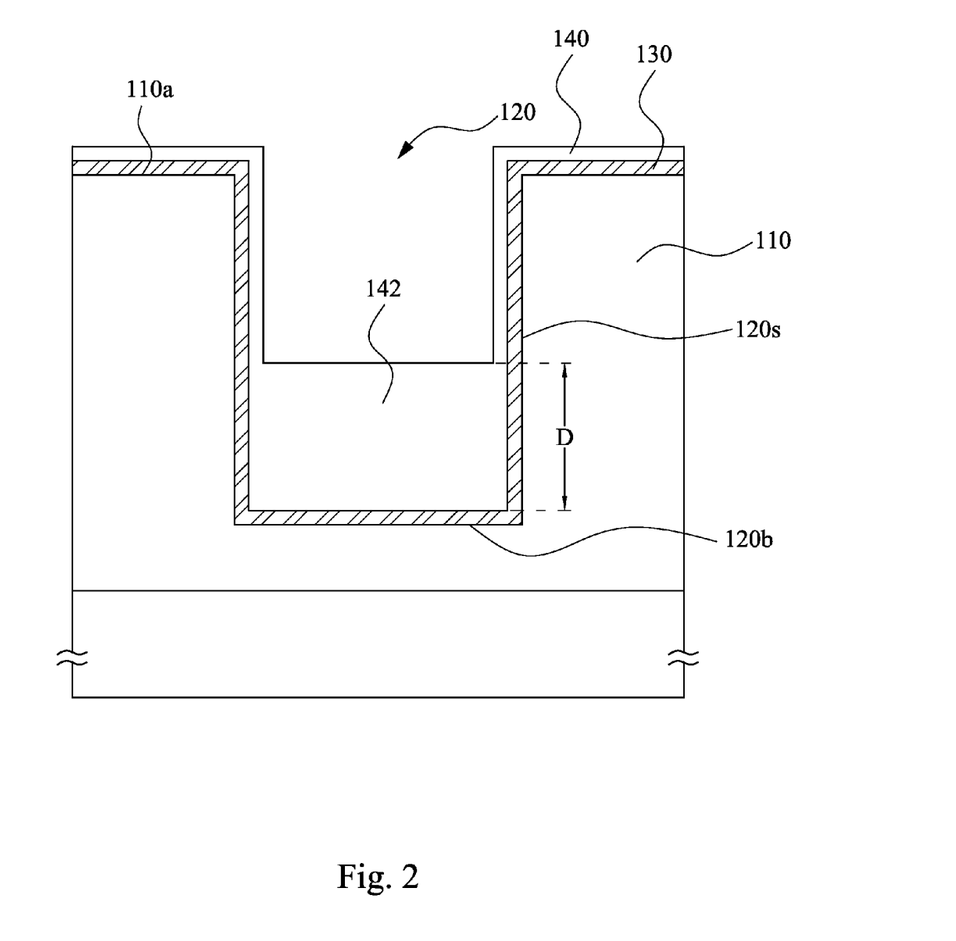

Referring to FIG. 2, a first barrier layer 130 is formed over the trench 120 as well as the dielectric layer 110 through a suitable deposition process, such as physical vapor deposition (PVD), chemical vapor deposition (CVD), atomic layer deposition (ALD), a combination thereof, or another suitable process. The sidewall portion 120s and the bottom portion 120b of the trench 120 are lined with the first barrier layer 130. In examples, the first barrier layer 130 is conformally formed to cover the trench 120 and the top surface 110a of the dielectric layer 110. Throughout the description, the first the barrier layer 130 is alternatively referred to as a diffusion barrier layer or a lining barrier layer. In some embodiments, the first the barrier layer 130 include titanium, titanium nitride, tantalum, tantalum nitride, or other alternatives. The thickness of barrier layer 130 may be, for example, between about 10 angstroms and about 200 angstroms. One skilled in the art will realize, however, that the dimensions recited throughout the description are provided for illustrative purposes only to further explain applications of some illustrative embodiments and are not meant to limit the disclosure in any manner.

A conductive layer 140 is formed over the first barrier layer 130, as shown in FIG. 2. According to various embodiments of the present disclosure, the act of forming the conductive layer 140 includes forming a conductive wiring 142 such as a copper wiring in the bottom of the trench 120. In some embodiments, the conductive wiring 142 has a thickness D that is about 20% to about 60% of the depth H (shown in FIG. 1) of the trench 120. According to some embodiments of present disclosure, when the thickness D of conductive wiring 142 is greater than a certain value, complex difficulties are arisen in deposition process and/or the subsequent polishing process. On the other hand, when the thickness D of conductive wiring 142 is less than a certain value, the conductivity of the conductive wiring 142 is possibly too low. In some examples, the thickness D is about 30% to about 50% of the depth H of the trench 120. In yet some embodiments, the thickness D of the conductive wiring 142 is greater than the thickness of the conductive layer 140 which is formed on the top surface 110a of the dielectric layer 110. For various embodiments of the present disclosure, the conductive layer 140 may be a metal alloy layer containing at least a main metal element such as for example copper, and an additive element such as for example manganese (Mn) or aluminum (Al). In some embodiment, the conductive layer 140 is a copper-manganese (CuMn) layer. In other embodiments, Ti, Al, Nb, Cr, V, Y, Re, or the like can be utilized as an additive metal to form the conductive layer 140. The conductive layer 140 may be deposited by using physical vapor deposition (PVD), chemical vapor deposition (CVD), plasma enhanced CVD (PECVD), low pressure CVD (LPCVD), or other well-known deposition techniques.

Figure 3:
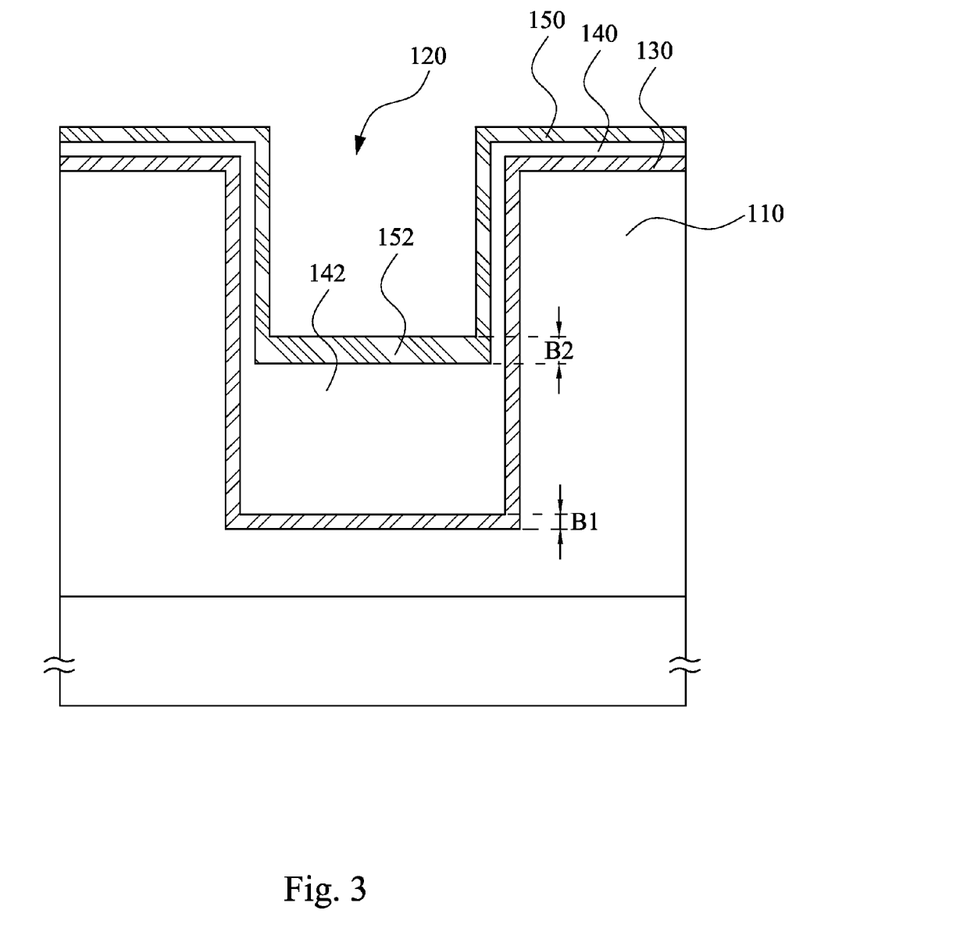

With reference to FIG. 3, a second barrier layer 150 is formed over the conductive layer 140. The second barrier layer 150 has a bottom portion 152 positioned in the trench 120 and on the conductive wiring 142. In some embodiments, the bottom portion 152 of the second barrier layer 150 has a thickness B2 that is about 0.5 fold to 3 folds of a thickness B1 of the first barrier layer 130. For example, the thickness B2 of the bottom portion 152 may be about 10 angstroms to about 50 angstroms. Throughout the description, the second barrier layer 150 is alternatively referred to as a diffusion barrier layer or a capping barrier layer. In some embodiments, the second barrier layer 150 is made of a material the same as the first barrier layer 130. For instance, the second barrier layer 150 may be made of titanium, titanium nitride, tantalum, tantalum nitride, or the likes. In yet some embodiments, the second barrier layer 150 may be formed through an approach such as physical vapor deposition (PVD), chemical vapor deposition (CVD), atomic layer deposition (ALD), combination thereof, or another suitable process. According to various embodiments of the present disclosure, the second barrier layer 150 does not include cobalt, which undesirably needs an expensive depositing apparatus.

Figure 4:
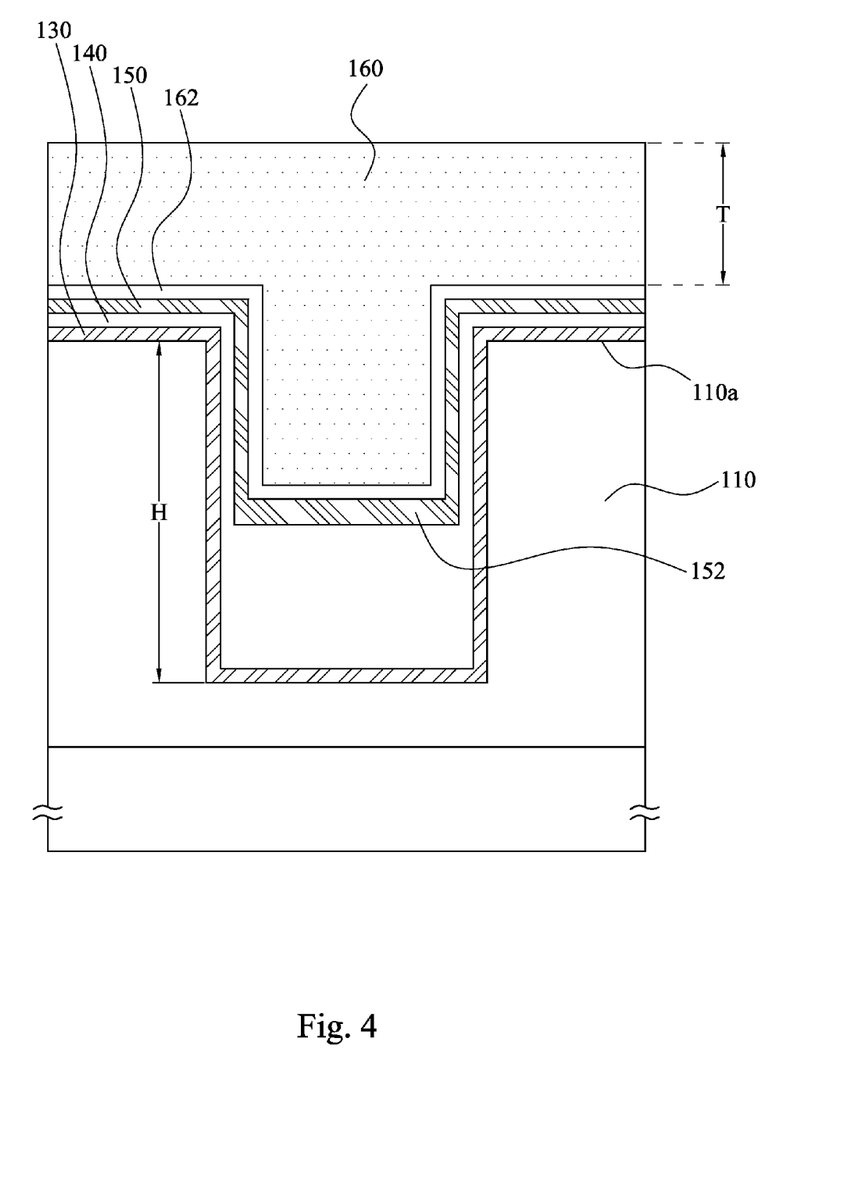

With reference to FIG. 4, a metallic sacrificial layer 160 is formed to cover the second barrier layer 150 and to fill the trench 120. The metallic sacrificial layer 160 has a portion over the top surface 110a of the dielectric layer 110. The metallic sacrificial layer 160 is provided as a mat for a subsequent polishing process to improve the polish uniformity. In some embodiments, the portion of the sacrificial layer 160 over the top surface 110a of the dielectric layer 110 has a thickness T that is greater than the depth H of the trench 120. In examples, the thickness T of metallic sacrificial layer 160 is about 3000 angstroms to about 10000 angstroms. Furthermore, electrochemical plating (ECP) techniques, electroless plating techniques or other suitable approaches may be employed to form the metallic sacrificial layer 160. In some embodiments, both the metallic sacrificial layer 160 and the conductive layer 140 include a same material such as for example cupper. In yet some embodiments, the metallic sacrificial layer 160 may include various materials such as tungsten, aluminum, gold, silver, and the like.

In some embodiments, a seed layer 162 is optionally formed on the second barrier layer 150 prior to forming the metallic sacrificial layer 160. In some examples, the seed layer 162 includes cupper alloy such as for example CuMn. In yet some embodiments, Al, Cr, Nb, V, Y, Tc, Ti, or the like can be utilized as an additive metal for forming the seed layer 162. The seed layer 162 may be formed by using chemical vapor deposition (CVD), plasma enhanced CVD (PECVD), low pressure CVD (LPCVD), physical vapor deposition (PVD), or other suitable deposition techniques.

Figure 5:
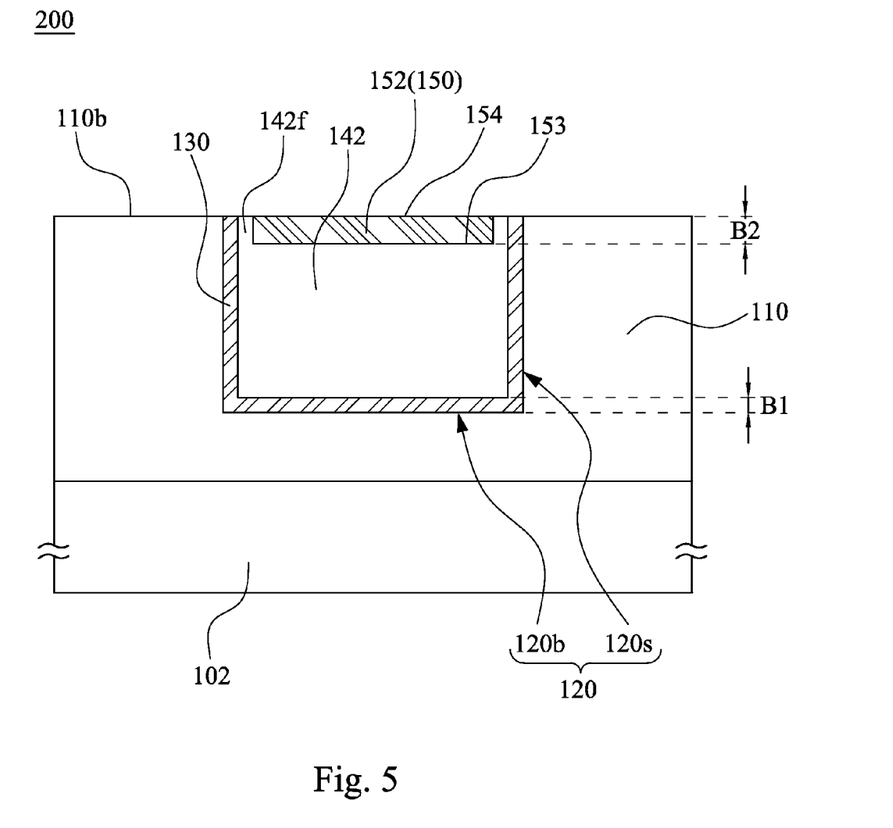

After the formation of the metallic sacrificial layer 160, a polishing process is performed to remove the metallic sacrificial layer 160 and the materials positioned above the bottom portion 152 of the second barrier layer 150, and thereby forming the semiconductor structure 200 as shown in FIG. 5. In detail, the polishing process includes removing the portions of the second barrier layer 150, the conductive layer 140 and the first barrier layer 130, which are over the top surface 110a of the dielectric layer 110. Furthermore, a portion of the dielectric layer 110 is removed in the polishing process so as to expose the bottom portion 152 of the second barrier layer 150. In various embodiments of the present disclosure, the act of performing the polishing process includes removing the metallic sacrificial layer 160 completely and reducing a thickness of the dielectric layer 110 by a chemical mechanical polishing (CMP) process.

Figure 6A:
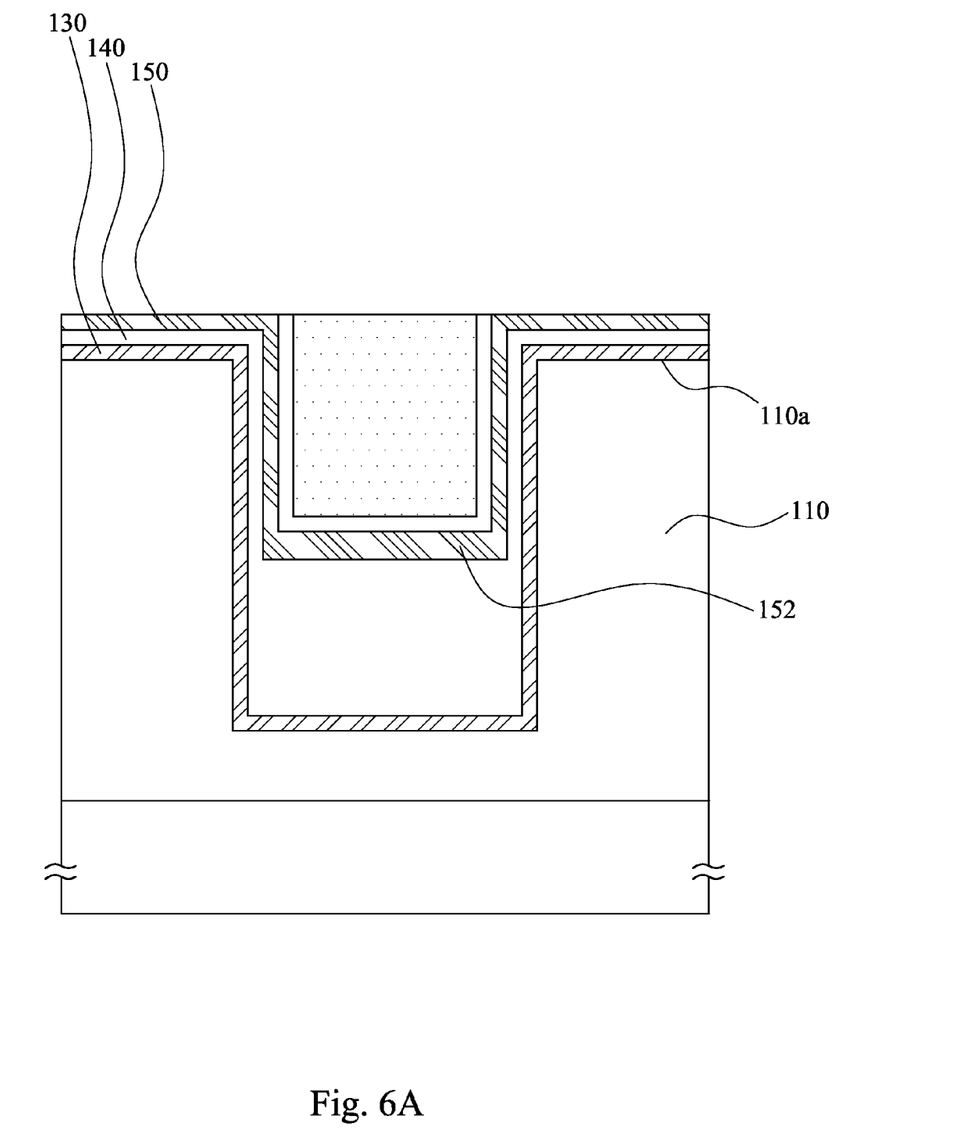
FIGS. 6A-6B are cross-sectional diagrams illustrating various polishing steps according to various embodiments of the present disclosure.

In some embodiments, the polishing process includes a first polishing step, with the second barrier layer 150 as a polishing stop layer as illustrated in FIG. 6A, in which a portion of the metallic sacrificial layer 160 is removed. In some examples, when the thickness of the metallic sacrificial layer 160 is less than a certain value such as for example 3000 angstroms, the uniformity of the polished surface is unacceptable. On the other hand, when the thickness of the metallic sacrificial layer 160 is greater than a certain value such as for example 10000 angstroms, it undesirably wastes the material and the time period of the polish process. Accordingly, in some embodiments, the thickness T (shown in FIG. 4) of the metallic sacrificial layer 160 is about 3000-6000 angstroms.

Figure 6B:
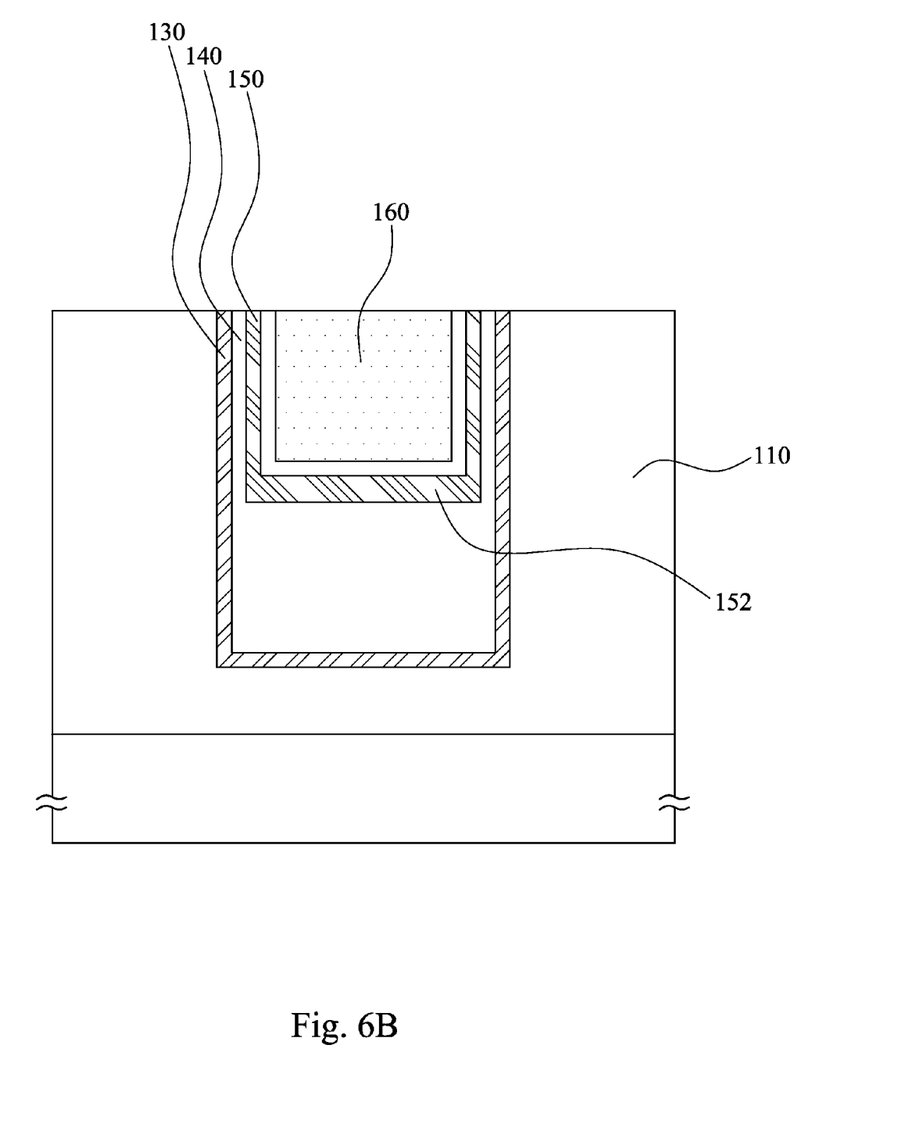

In yet some embodiments, the polishing process includes a second polishing step, as illustrated in FIG. 6B. The second polishing step is performed to remove portions of the second barrier layer 150, the conductive layer 140 and the first barrier layer 130 to expose the dielectric layer 110. In some embodiments, the slurry used in the second polishing step is different from that used in the first polishing step.

In yet some embodiments, the polishing process includes a third polishing step, with the bottom portion 152 of the second barrier layer 150 as a polishing stop layer, as illustrated in FIG. 5. The third polishing step is performed to reduce the thickness of the dielectric layer 110 and to remove the remaining portion of the metallic sacrificial layer 160 in the trench 120, and thereby exposing the bottom portion 152 of the second barrier layer 150. In the third polishing step, the bottom portion 152 of the second barrier layer 150 may be partially removed. Therefore, according to some embodiments of the present disclosure, the thickness B2 of the second barrier layer 150 is about 0.5-3.0 folds of the thickness B1 of the first barrier layer 130.

According to another aspect of the present disclosure, a semiconductor structure is disclosed. As illustrated in FIG. 5, the semiconductor structure 200 includes a dielectric layer 110, a first barrier layer 130, a conductive wiring 142 and a second barrier layer 150. The dielectric layer 110 is disposed over a substrate 102. Furthermore, the dielectric layer 110 has a trench 120 extending from a top surface 110b of the dielectric layer 110 into the dielectric layer 110. The trench 120 has a sidewall portion 120s and a bottom portion 120b, which are lined with the first barrier layer 130. The conductive wiring 142 is disposed in the trench 120. The second barrier layer 150 is inlaid into the conductive wiring 142 and serves as a capping barrier layer on the conductive wiring 142. The second barrier layer 150 is spaced apart from the first barrier layer 130. The first barrier layer 130 and the second barrier layer 150 are configured to prevent the material of the conductive wiring 142 from diffusing out of the trench 120.

In some embodiments, the second barrier layer 150 has bottom surface 153 positioned below the top surface 110b of the dielectric layer 110. In addition, the second barrier layer 150 has a top surface 154 that extends on the same level as the top surface 110b of the dielectric layer 110. In yet some embodiments, the second barrier layer 150 does not extend out of the trench 120.

In yet some embodiments, the first barrier layer 130 and the second barrier layer 150 are made of an identical material such as titanium, titanium nitride, tantalum, tantalum nitride or a combination thereof.

In yet some embodiments, the second barrier layer 150 has a thickness B2 that is about 1.5 folds to about 3 folds of the thickness B1 of the first barrier layer 130.

In yet some embodiments, the conductive wiring 142 has a flange 142f that is interposed between the second barrier layer 150 and the first barrier layer 130. In examples, the height of the flange 142f is about 1.5-3.0 folds of the thickness B1 of the first barrier layer 130.

In accordance with another aspect of some embodiments, a semiconductor structure includes a dielectric layer over a substrate, a trench extending from a top surface of the dielectric layer into the dielectric layer, a first barrier layer lining the trench, a conductive wiring and a second barrier layer. The trench has a sidewall portion and a bottom portion, which is lined with the first barrier layer. The conductive wiring is disposed in the trench and has a flange. The second barrier layer is inlaid into the conductive wiring and spaced apart from the first barrier layer. The flange of conductive wiring is interposed between the second barrier layer and the first barrier layer. Further, the second barrier layer has a top surface extending on the same level as a top edge of the flange.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor structure, comprising:
   forming a dielectric layer overlaying a substrate;
   forming a trench in the dielectric layer;
   forming a first barrier layer overlaying the dielectric layer and lining the trench;
   forming a conductive layer overlaying the first barrier layer;
   forming a second barrier layer overlaying the conductive layer, wherein the second barrier layer has a bottom portion positioned in the trench;
   forming a metallic sacrificial layer to cover the second barrier layer and to fill the trench; and
   performing a polishing process to remove the metallic sacrificial layer, and portions of the second barrier layer, the conductive layer, the first barrier layer and the dielectric layer to expose the bottom portion of the second barrier layer.

2. The method according to claim 1, wherein the act of forming the second barrier layer comprising depositing a same material as the first barrier layer.

3. The method according to claim 1, wherein the act of forming the second barrier layer comprising forming a layer containing a material selected from the group consisting of titanium, titanium nitride, tantalum, tantalum nitride and a combination thereof.

4. The method according to claim 1, wherein the bottom portion of the second barrier layer has a thickness that is about 0.5 fold to 3 folds of a thickness of the first barrier layer.

5. The method according to claim 1, wherein the act of forming the conductive layer comprising forming a copper wiring in the trench, and the copper wiring has a thickness of about 20% to about 60% of a depth of the trench.

6. The method according to claim 1, further comprising forming a seed layer overlaying the second barrier layer prior to forming the metallic sacrificial layer.

7. The method according to claim 1, wherein the seed layer comprises copper.

8. The method according to claim 1, wherein the act of forming the metallic sacrificial layer comprises electro-chemical plating a copper layer over the dielectric layer and filling the trench.

9. The method according to claim 1, wherein the metallic sacrificial layer has a portion out of the trench and over the dielectric layer, and the portion of the metallic sacrificial layer has a thickness that is greater than a depth of the trench.

10. The method according to claim 1, wherein the metallic sacrificial layer has a thickness of about 3000 angstroms to about 10000 angstroms.

11. The method according to claim 1, wherein the act of performing the polishing process comprises removing the metallic sacrificial layer completely and reducing a thickness of the dielectric layer by using a chemical mechanical polishing process.

12. The method according to claim 1, wherein the act of performing the polishing process comprises:
   performing a first polishing to remove a portion of the metallic sacrificial layer, with the second barrier layer as a polishing stop layer;
   performing a second polishing to remove portions of the second barrier layer, the conductive layer and the first barrier layer, with the dielectric layer as a polishing stop layer, wherein the second polishing uses a slurry that is different from a slurry used in the first polishing; and
   performing a third polishing to reduce a thickness of the dielectric layer and remove a remaining portion of the metallic sacrificial layer in the trench, and thereby exposing the bottom portion of the second barrier layer.

13. A method of fabricating a semiconductor structure, comprising:
   forming a dielectric layer having a trench over a substrate;
   forming a first barrier layer overlaying the dielectric layer and lining the trench;
   forming a conductive layer overlaying the first barrier layer;
   forming a second barrier layer overlaying the conductive layer, wherein the second barrier layer is separated from the first barrier layer by the conductive layer, and has a bottom portion positioned in the trench;
   forming a metallic sacrificial layer to cover the second barrier layer and to fill the trench; and
   removing the metallic sacrificial layer and portions of the second barrier layer, the conductive layer, the first barrier layer and the dielectric layer to expose the bottom portion of the second barrier layer.

14. The method according to claim 13, wherein the act of forming the second barrier layer comprising depositing a same material as the first barrier layer.

15. The method according to claim 14, wherein the bottom portion of the second barrier layer has a thickness that is about 0.5 fold to 3 folds of a thickness of the first barrier layer.

16. The method according to claim 13, wherein the act of forming the conductive layer comprising forming a copper wiring in the trench, and the copper wiring has a thickness of about 20% to about 60% of a depth of the trench.

17. The method according to claim 13, wherein the metallic sacrificial layer has a portion out of the trench and over the dielectric layer, and the portion of the metallic sacrificial layer has a thickness that is greater than a depth of the trench.

18. The method according to claim 13, wherein the act of performing the polishing process comprises:
   performing a first polishing to remove a portion of the metallic sacrificial layer, with the second barrier layer as a polishing stop layer;
   performing a second polishing to remove portions of the second barrier layer, the conductive layer and the first second barrier layer, with the dielectric layer as a polishing stop layer, wherein the second polishing uses a slurry that is different from a slurry used in the first polishing; and
   performing a third polishing to reduce a thickness of the dielectric layer and remove a remaining portion of the metallic sacrificial layer in the trench, and thereby exposing the bottom portion of the second barrier layer.

19. The method according to claim 13, wherein the metallic sacrificial layer has a thickness of about 3000 angstroms to about 10000 angstroms.

20. A method of fabricating a semiconductor structure, comprising:
   forming a dielectric layer overlaying a substrate;
   forming a trench in the dielectric layer;
   forming a first barrier layer overlaying the dielectric layer and lining the trench;
   forming a conductive layer overlaying the first barrier layer;
   forming a second barrier layer overlaying the conductive layer, wherein the second barrier layer has a bottom portion positioned in the trench;
   forming a metallic sacrificial layer to cover the second barrier layer and to fill the trench; and
   performing a polishing process to remove the metallic sacrificial layer and portions of the second barrier layer, the conductive layer, the first barrier layer and the dielectric layer to expose the bottom portion of the second barrier layer, wherein a remained portion of the conductive layer includes a flange having a top surface substantially leveled with an exposed surface of the bottom portion of the second barrier layer.

* * * * *